United States Patent
Hokibara et al.

(10) Patent No.: US 7,861,387 B2
(45) Date of Patent: Jan. 4, 2011

(54) METHOD FOR MANUFACTURING PIEZOELECTRIC RESONATOR ELEMENT

(75) Inventors: Akira Hokibara, Hino (JP); Sachi Yamamoto, Hino (JP)

(73) Assignee: Epson Toyocom Corporation (JP)

( * ) Notice: Subject to any disclaimer, the term of this patent is extended or adjusted under 35 U.S.C. 154(b) by 526 days.

(21) Appl. No.: 11/689,669

(22) Filed: Mar. 22, 2007

(65) Prior Publication Data

US 2007/0222342 A1 Sep. 27, 2007

(30) Foreign Application Priority Data

Mar. 23, 2006 (JP) .............................. 2006-080404

(51) Int. Cl.
*H01L 41/04* (2006.01)
*B44C 1/22* (2006.01)
(52) U.S. Cl. .................... 29/25.35; 29/594; 29/896.22; 310/312; 310/370; 430/314; 216/41; 216/57
(58) Field of Classification Search ................ 29/25.35, 29/594, 896.22; 310/312, 313 R, 321, 340, 310/370, 367; 430/314, 322; 216/41, 48, 216/57
See application file for complete search history.

(56) References Cited

U.S. PATENT DOCUMENTS

| | | | | |
|---|---|---|---|---|
| 5,695,896 | A * | 12/1997 | Pierrat | 430/314 X |
| 6,496,085 | B2 * | 12/2002 | Ella et al. | 29/25.35 X |
| 6,661,162 | B1 * | 12/2003 | Nagai et al. | 310/340 |
| 6,719,914 | B2 * | 4/2004 | Nakatani et al. | 216/57 X |
| 2003/0071542 | A1 * | 4/2003 | Satoh et al. | 310/367 |

FOREIGN PATENT DOCUMENTS

| | | |
|---|---|---|
| EP | 1 523 096 | 4/2005 |
| JP | 57-166399 | 10/1982 |
| JP | 08-111623 | 4/1996 |
| JP | 08-242134 | 9/1996 |

(Continued)

OTHER PUBLICATIONS

Saravanan et al; "Surface Micromachined Fabrication of Piezoelectric AlN Unimorph Suspension Devices for RF Resonator Applications"; 13th International Conference on Solid State Sensors, Actuators and Microsystems; Jun. 2005; pp. 1362-1365.*

*Primary Examiner*—A. Dexter Tugbang
(74) *Attorney, Agent, or Firm*—Harness, Dickey & Pierce, P.L.C.

(57) ABSTRACT

A method for manufacturing a piezoelectric resonator element from a substrate made of piezoelectric material is provided. The method includes forming a first dry etching mask in a first masking region of a first surface of the substrate in a first mask forming process and performing a first dry etching process to remove a portion of the substrate in areas between the first dry etching mask after the first mask forming process. The method further includes maintaining a first un-etched portion of the substrate between the first dry etching mask after the first dry etching process and removing the first dry etching mask in a mask removing process after the first dry etching process. A wet etching process is performed to remove the first un-etched portion of the substrate after the mask removing process, thereby forming the piezoelectric resonator element.

7 Claims, 6 Drawing Sheets

FOREIGN PATENT DOCUMENTS

| JP | 09-083281 | 3/1997 |
| JP | 2002-374146 | 12/2002 |
| JP | 2003-198303 | 7/2003 |
| JP | 2005-130218 | 5/2005 |
| JP | 2006-121411 | 5/2006 |
| JP | 2007281657 A * | 10/2007 |

* cited by examiner

US 7,861,387 B2

METHOD FOR MANUFACTURING PIEZOELECTRIC RESONATOR ELEMENT

CROSS-REFERENCE TO RELATED APPLICATIONS

This application claims the benefit of Japanese Patent Application No. 2006-80404, filed Mar. 23, 2006. The disclosure of the above application is incorporated herein by reference.

TECHNICAL FIELD

The present invention relates to a method for manufacturing a piezoelectric resonator element.

BACKGROUND ART

A following method has been known as a method for forming a piezoelectric resonator element by processing a quartz substrate as a piezoelectric material. Such a method has been know, that a quartz resonator as the piezoelectric resonator element is processed by reactive ion etching as dry etching (for example, see Patent Document 1). The dry etching enables a processing that is less affected by anisotropy of the quartz substrate.

[Patent Document 1] JP-A-8-242134 (Page 3, Paragraphs [0020] to [0022])

DISCLOSURE OF THE INVENTION

[Problems to be Solved by the Invention]

The processing by the dry etching produces an affected layer on the surface of the substrate due to rise in temperature, mixing, or the like resulting from ion collision. This affected layer does not exhibit the same piezoelectric property as that of the substrate, thereby decreasing an area that functions effectively as a piezoelectric resonator element. Furthermore, it is difficult to design a resonating property of the piezoelectric resonator element including the affected layer because of the difficulty of predicting a piezoelectric property of the affected layer. The present invention is intended to provide a method for manufacturing a piezoelectric resonator element that has the small affected layer and a resonating property not much different from the designed property.

[Means for Solving the Problems]

A method for manufacturing a piezoelectric resonator element according to one aspect of the invention is to manufacture a piezoelectric resonator element from a substrate made of a piezoelectric material, the method includes forming a dry etching mask on the substrate in a mask forming process, etching the substrate such that part of an etching-processed portion of the substrate is left unetched in a dry etching process after the mask forming process, removing the dry etching mask in a mask removing process after the dry etching process, and removing the part of the etching-processed portion by a wet etching to form the piezoelectric resonator element separately from the substrate in a wet etching process after the mask removing process.

According to this aspect of the invention, the piezoelectric resonator element is formed separately by the wet etching after removal of the dry etching mask, so that the affected layer, which results from the dry etching, is exposed and the whole or the most of the affected layer is removed by the wet etching. As a result, the method for manufacturing the piezoelectric resonator element, that has the small affected layer on a surface and a resonating property not much different from a designed resonating property, can be achieved.

According to the aspect of the invention, it is preferable that each of surfaces of the substrate be subject to the wet etching process after the mask forming process, the dry etching process, and the mask removing process. In addition to the above-mentioned effect, this aspect of the invention produces such an effect that both surfaces of the piezoelectric resonator element can be processed in a manner to be hardly affected by anisotropy of the substrate by the dry etching since both surfaces of the substrate are processed by the dry etching.

According to the aspect of the invention, it is preferable that the wet etching be performed to a front surface of the substrate provided with the dry etching mask in the wet etching process. According to one aspect of the invention, the affected layer formed on the surface of the substrate provided with the mask is removed by the wet etching.

According to the aspect of the invention, it is preferable that the piezoelectric resonator element be a tuning-fork quartz resonator element. According this aspect of the invention, the tuning-fork quartz resonator element has a resonating arm with a wide resonating range and is easily affected by the affected layer, so that the method for manufacturing the piezoelectric resonator element producing great effects can be achieved.

EXPLANATION OF REFERENCE NUMERALS

10 . . . a quartz resonator element as a piezoelectric resonator element, 20 . . . a quartz substrate as a substrate made of a piezoelectric material, 25 . . . an etching-processed portion, 30 . . . a metal mask as a dry etching mask.

BEST MODE FOR CARRYING OUT THE INVENTION

Figure 1A:
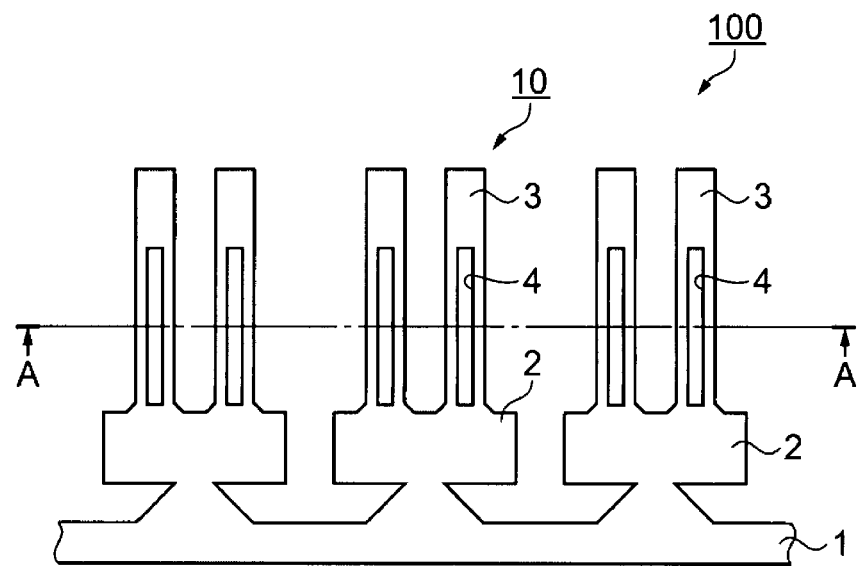
FIG. 1 (a) is a plan view of a quartz-resonator-element-coupled-body according to a first embodiment of the invention, and FIG. 1 (b) is a cross-sectional view of FIG. 1 (a) along the line A-A.
Figure 1B:
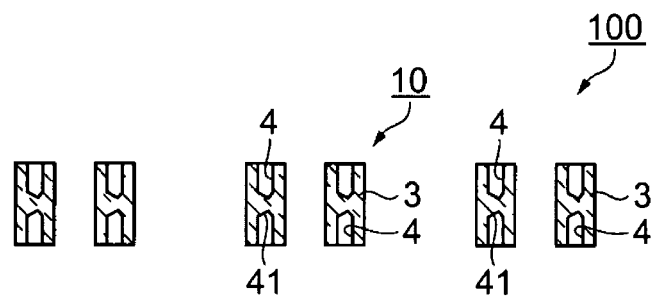
Figure 2:
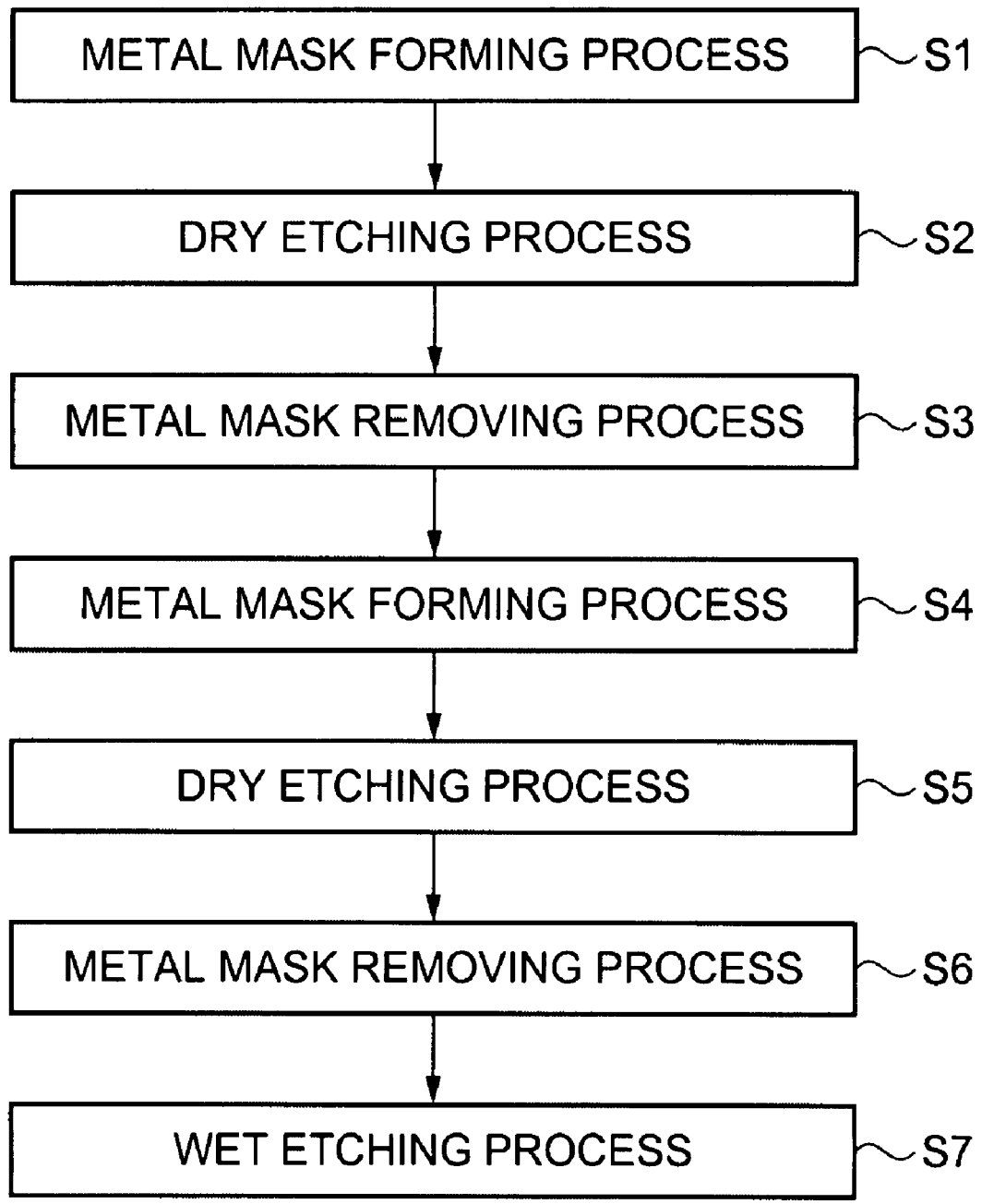
FIG. 2 is a flow chart showing a method for manufacturing a tuning-fork quartz resonator element.
Figure 3A:
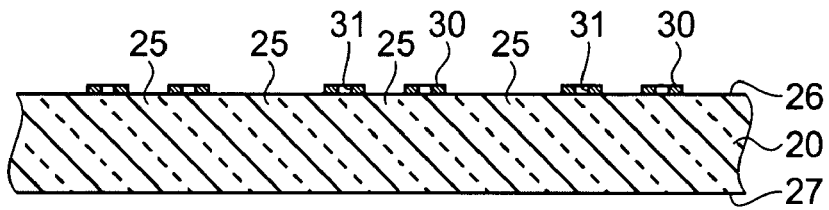
FIG. 3 shows cross-sectional views of general parts showing the method for manufacturing the tuning-fork quartz resonator element.
Figure 3B:
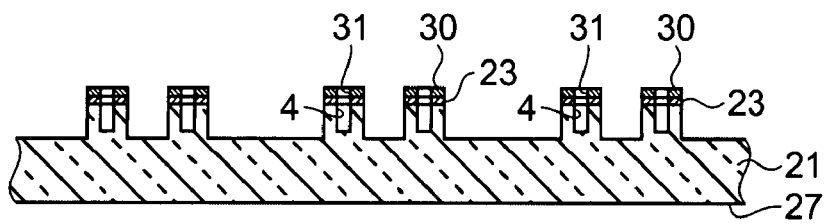
Figure 3C:
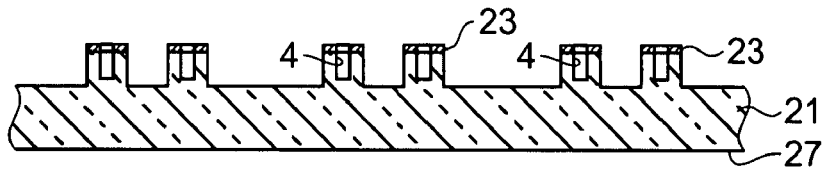
Figure 3D:
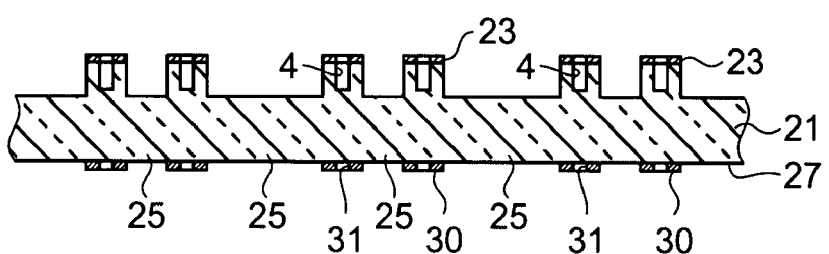
Figure 3E:
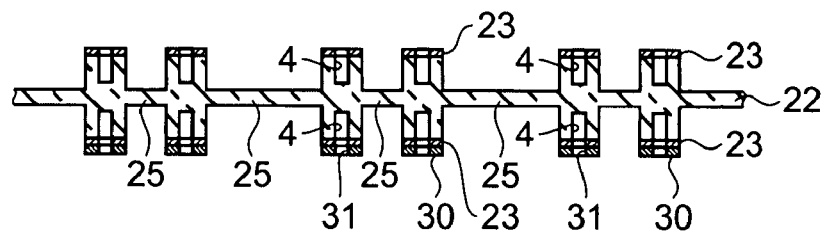
Figure 3F:
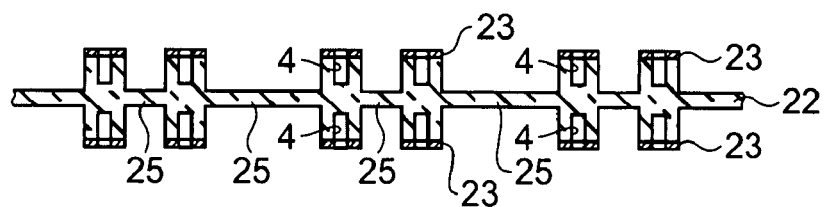
Figure 3G:
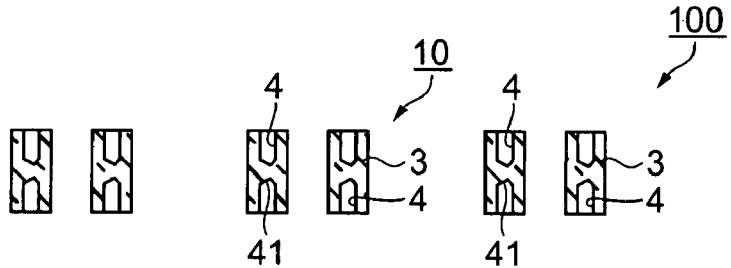
Figure 4A:
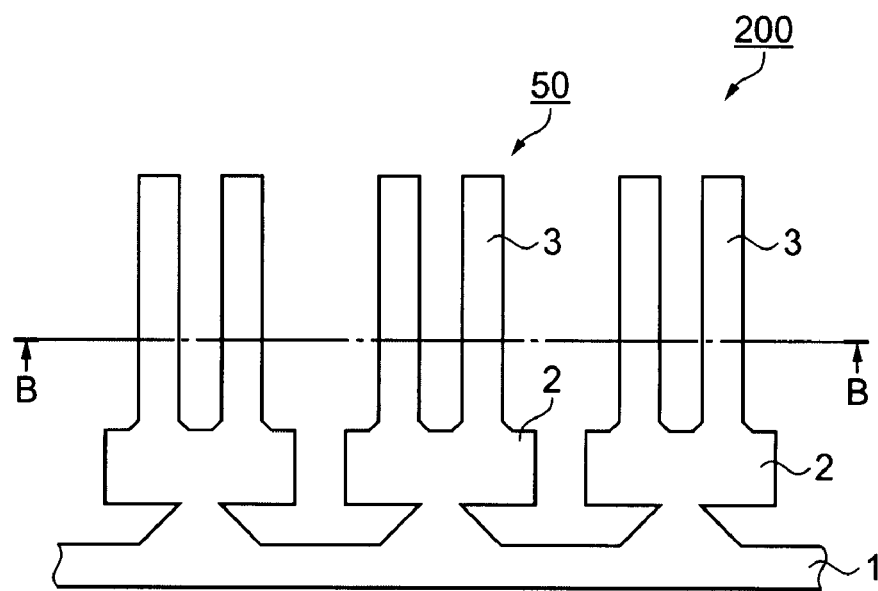
FIG. 4 (a) is a plan view of a quartz-resonator-element-coupled-body according to a second embodiment of the invention, and FIG. 4 (b) is a cross-sectional view of FIG. 4 (a) along the line B-B.
Figure 4B:
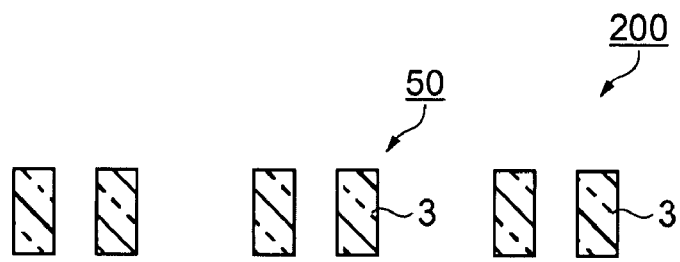
Figure 5A:
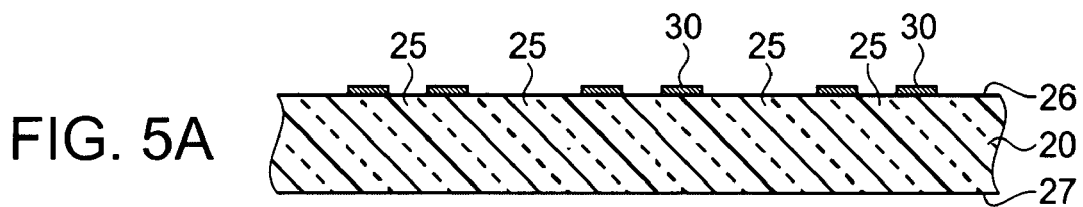
FIG. 5 shows cross-sectional views of general parts showing a method for manufacturing a tuning-fork quartz resonator element.
Figure 5B:
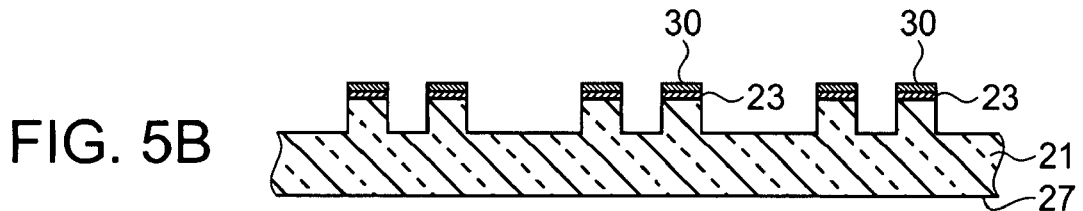
Figure 5C:
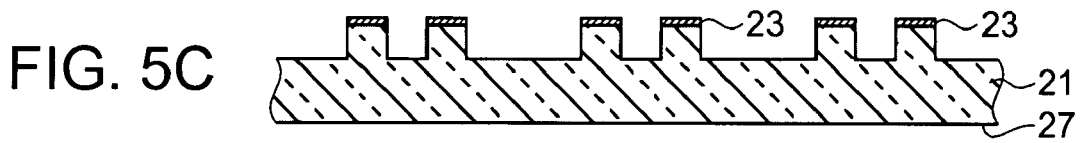
Figure 5D:
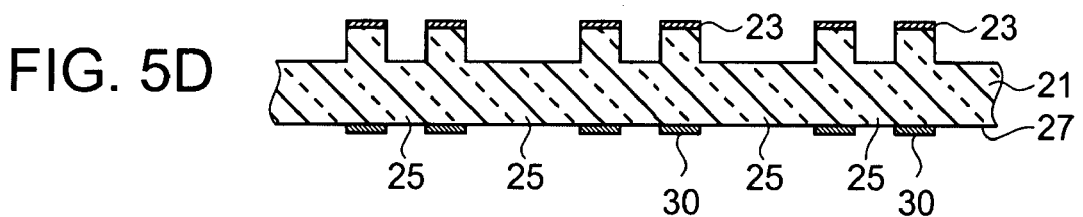
Figure 5E:
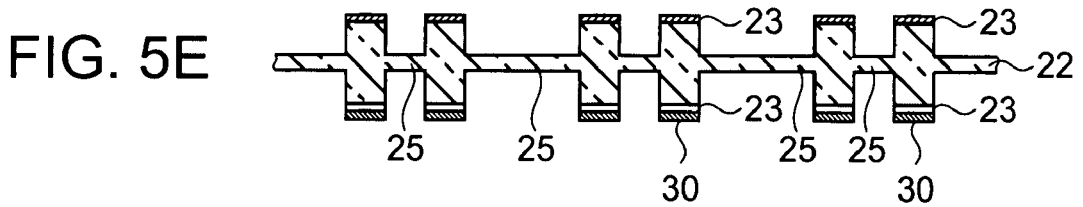
Figure 5F:
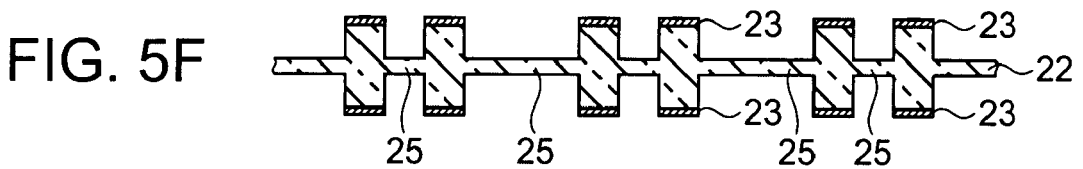
Figure 5G:
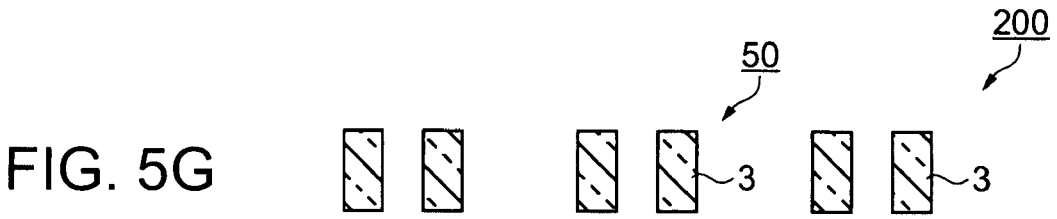
Figure 6A:
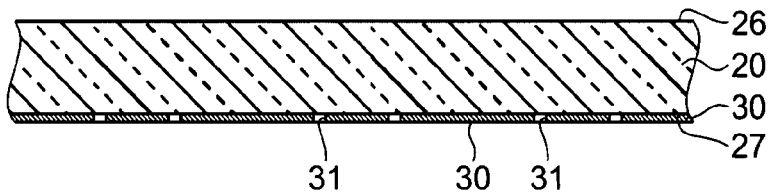
FIG. 6 shows cross-sectional views of general parts showing a method for manufacturing a tuning-fork quartz resonator element according to a third embodiment of the invention.
Figure 6B:
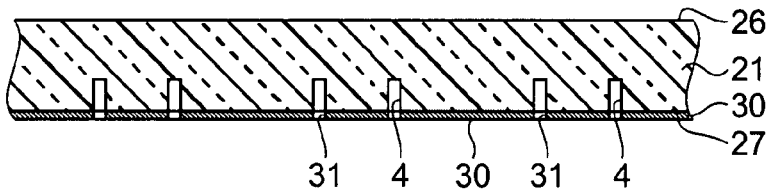
Figure 6C:
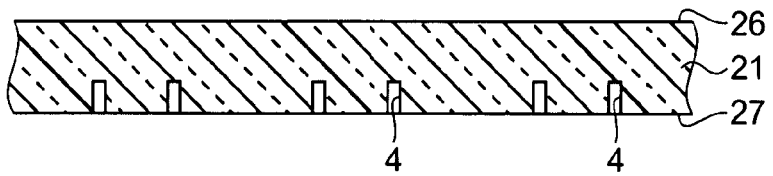
Figure 6D:
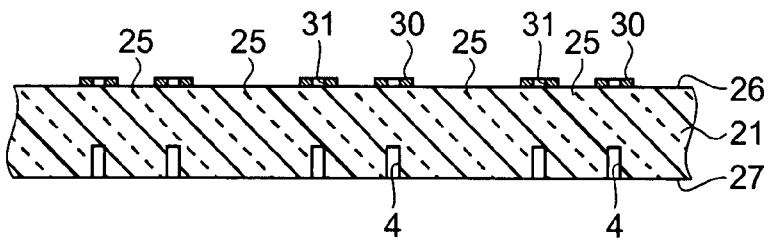
Figure 6E:
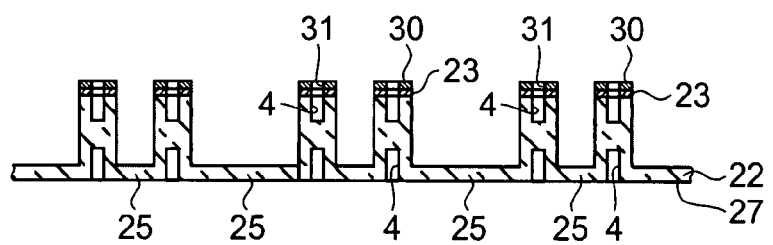
Figure 6F:
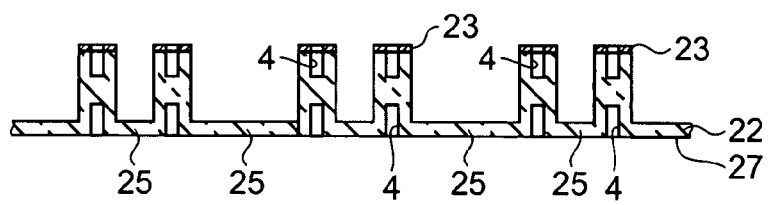
Figure 6G:
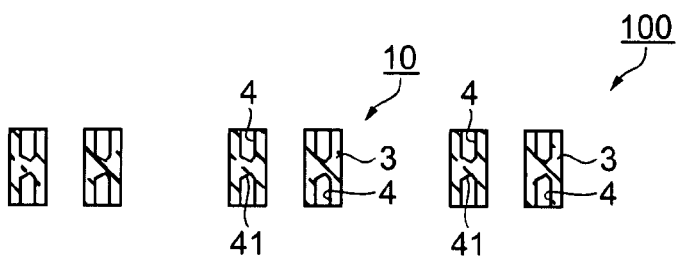

Hereinafter, embodiments of this invention will be explained with reference to drawings. In explanation, the same reference numerals are assigned to constituent elements that are common in each embodiment. FIGS. 1 to 3 show a first embodiment and FIGS. 4 and 5 shows a second embodiment.

First Embodiment

FIG. 1 shows a quartz-resonator-element-coupled-body 100 according to this embodiment, in which tuning-fork quartz resonator elements 10 as a piezoelectric resonator element are coupled. FIG. 2 shows a flow chart showing a method for manufacturing each tuning-fork quartz resonator element 10. FIG. 3 shows cross-sectional views of general parts showing the method for manufacturing the tuning-fork quartz resonator element 10.

FIG. 1 (a) shows a plan view of the quartz-resonator-element-coupled-body 100, and FIG. 1 (b) is a cross-sectional view of FIG. 1 (a) along the line A-A. The tuning-fork quartz resonator elements 10 are coupled through a supporter 1 of the quartz-resonator-element-coupled-body 100 and are aligned in a row. In FIG. 1, three tuning-fork quartz resonator elements 10 are coupled but in reality, more than three tuning-fork quartz resonator elements 10, not shown, are coupled. Each of the tuning-fork quartz resonator elements 10 includes two resonating arms 3 at a base 2. Each of the resonating arms 3 has a cross section in a substantially letter H shape and is formed in a manner to extend from the base 2 in the same direction. The base 2 is coupled to the supporter 1. Flute 4 is provided in each of four ranges in main surfaces and the other main surfaces of two resonating arms 3. The flutes 4 have the substantially same shape in all of four ranges, in which each of the flutes 4 has a cross section in a substantially letter U shape. To be more precise, a bottom surface 41 of the flute 4 is not flat.

Hereinafter, the method for manufacturing the tuning-fork quartz resonator element 10 will be explained with reference to drawings. In FIG. 2, the method for manufacturing the tuning-fork quartz resonator element 10 includes a step 1 (S1) and a step 4 (S4) as a metal mask forming process defined as a mask forming process, a step 2 (S2) and a step 5 (S5) as a dry etching process, a step 3 (S3) and a step 6 (S6) as a metal mask removing process defined as a mask removing process, and a step 7 (S7) as a wet etching process. Used as a dry etching mask herein is a metal mask. In this embodiment, the wet etching process is performed after performance of the metal mask forming process, the dry etching process, and the metal mask removing process in twice.

FIG. 3 shows cross-sectional views of general parts, in which (a) illustrates S1; (B) illustrates S2; (c) illustrates S3; (d) illustrates S4; (e) illustrates S5; (f) illustrates S6; and (g) illustrates S7. In FIG. 3 (a), metal masks 30 are formed on a main surface 26 of the quartz substrate 20 as the substrate made of the piezoelectric material. The quartz substrate 20 is polished to uniform both of front and back surfaces. The metal masks 30 are formed in a manner to have an outline substantially the same as that when viewed from a side of the main surface the quartz-resonator-element-coupled-body 100 shown in FIG. 1 (a). Openings 31 are provided in the flutes 4. The metal mask 30 can be selectively formed by a photoresist method and a sputtering method, which are well known. Nickel or the like can be used as a material of the metal mask 30. A region in a thickness direction in the quartz substrate 20, where the metal masks 30 are not formed, becomes an etching-processed portion 25.

In FIG. 3 (b), the dry etching is performed. The quartz substrate 20 corresponding to the etching-processed portion 25 and the openings 31 of the metal masks 30 are etched by the etching. The flutes 4 are formed in the resonating arms 3. The dry etching is performed in a manner to leave part of the etching-processed portion 25 unetched. The dry etching is performed with an RIE (reactive ion etching) device as an oxide film dry etcher, which is generally adopted, using reaction gas such as $CHF_3$. A main surface 27 on the other side of the main surface 26 to be subject to the etching is brought in contact with a cooling sheet or the like in order to prevent rise in temperature of the quartz substrate 20.

At the time of the dry etching, surface temperature of the quartz substrate 20 rises because of ion collision, thereby producing an affected layer 23. FIG. 3 shows the affected layer at parts of the metal masks 30 only. However, the affected layer 23 is formed on surfaces where surface temperature rose. The affected layer 23 has different thicknesses and qualities depending on a location of a surface exposed to ion. Even on the surface of the quartz substrate 20, where the metal masks 30 are provided, the affected layer 23 is formed in association with rise in temperature of the metal masks 30.

At this point, the narrow flutes 4 and the other wide areas are different in dry etching rate according to a micro-loading effect as a dry etching characteristic. Therefore, the flutes 4 are etched more shallowly compared with the other areas even on the same etching condition. A portion corresponding to the flutes 4 and a side surface of the tuning-fork quartz resonator element 10 is formed by the dry etching, thereby not exhibiting etching anisotropy resulting from anisotropy of crystalline quartz. This portion is formed in a direction substantially perpendicular to the surface of the quartz substrate 20. A quartz substrate 21 can be obtained in a process of S2, in which the main surface 26 of the quartz substrate 20 has been subject to the dry etching In FIG. 3 (c), the metal mask 30 is removed. The metal mask 30 is removed by immersion in, e.g., an acid solution such as hydrochloric acid.

In FIG. 3 (b), the other main surface 27 of the quartz substrate 21 is provided with the metal masks 30 in a manner similar to S1.

In FIG. 3 (e), the dry etching is performed in a manner similar to S2. This dry etching is also performed in a manner to leave part of the etching-processed portion 25 unetched. Therefore, a quartz substrate 22, which is etched from both the main surface 26 and the other main surface 27, can be obtained through a process of S5.

In FIG. 3 (f), the metal masks 30 are removed in a manner similar to S3.

In FIG. 3 (g), the wet etching is performed. The affected layer 23 is removed while part of the etching-processed portion 25 is removed by the wet etching. In other words, the surface of the quartz substrate 20 provided with the meal masks 30 is subject to the wet etching by the wet etching. As a result, the affected layer 23 can be removed, which is formed on the surface of the quartz substrate 20 provided with the metal masks 30. Furthermore, because of the anisotropy of the crystalline quartz, the bottom surface 41 of the flute 4 is not etched to flatly. The wet etching is performed using hydrofluoric acid or the like. Herein, the tuning-fork quartz resonator elements 10 are formed separately from the quartz substrate 20, along with the quartz-resonator-element-coupled-body 100.

At last, the tuning-fork quartz resonator element 10 can be obtained by cutting off each of the tuning-fork quartz resonator elements 10 from the quartz-resonator-element-coupled-body 100. The embodiment as described above produces following effects.

(1) Since the tuning-fork quartz resonator elements 10 are formed separately by the wet etching after removal of the metal masks 30, the affected layer 23 resulting from the dry etching can be exposed and removed by the wet etching. In other words, the wet etching removes the affected layer 23 formed on the surface of the quartz substrate 20 provided with the metal masks 30. Therefore, the method for manufacturing the tuning-fork quartz resonator element 10 can be achieved, that exhibits the resonating property not much different from the designed resonating property.

(2) In addition to the aforementioned effect, since both of the surfaces of the quartz substrate 20 are processed by the dry etching, the flutes 4 in both of the surfaces of the tuning-fork quartz resonator element 10 can be subject to a process by which the anisotropy of the quartz substrate 20 by the dry etching has little effect.

Second Embodiment

FIG. 4 shows a quartz-resonator-element-coupled-body 200 according to this embodiment, in which tuning-fork quartz resonator elements 50 as a piezoelectric resonator element are coupled. FIG. 5 shows cross-sectional views of general parts showing a method for manufacturing the tuning-fork quartz resonator element 50.

FIG. 4 (a) shows a plan view of the quartz-resonator-element-coupled-body 200 and FIG. 4 (b) shows a cross-sectional view of FIG. 4 (a) along the line B-B. The second embodiment has the same structure as that of the first embodiment except that the tuning-fork quartz resonator elements 50 are not provided with the flutes 4.

Hereinafter, the method for manufacturing the tuning-fork quartz resonator element 50 will be explained with reference to drawings. This embodiment also includes processes and steps as shown in FIG. 2. FIG. 5 shows cross-sectional views of general parts, in which (a) illustrates S1; (b) illustrates S2; (c) illustrates S3; (d) illustrates S4; (e) illustrates S5; (f) illustrates S6; and (g) illustrates S7. FIGS. 5 (a) and 5 (b) show S1 and S4 as a process for forming the metal mask, which is different from that of the first embodiment in that the openings 31 are not formed. This process is the same as that of the first embodiment in the other structures.

In a manner similar to the first embodiment, the tuning-fork quartz resonator element 50 can be obtained by cutting off each of the tuning-fork quartz resonator elements 50 from the quartz-resonator-element-coupled-body 200 after the processes of S1 to S7. According to this embodiment as described above, the tuning-fork quartz resonator element 50 without the flutes 4 produces the same effect as that of the first embodiment.

Third Embodiment

FIG. 6 shows cross-sectional view of general parts showing a method for manufacturing the tuning-fork quartz resonator element 10 according to a third embodiment of this invention. The quartz-resonator-element-coupled-body 100 is the same as shown in FIG. 1 that illustrates the first embodiment.

FIG. 6 shows cross-sectional views of general parts, in which (a) illustrates S1; (b) illustrates S2; (c) illustrates S3; (d) illustrates S4; (e) illustrates S5; (f) illustrates S6; and (g) illustrates S7. In FIG. 6 (a), the metal mask 30 is formed on the main surface 27 of the quartz substrate 20. The metal mask 30 is formed on the entire surface 27 and is provided with the openings 31 for the flutes 4. In FIG. 6 (b), the dry etching is performed. The dry etching is performed to parts of the quartz substrate 20, which are corresponding to the opening 31 of the metal mask 30, and the main surface 27 is provided with the flutes 4 only. During the dry etching, the other main surface 26 is cooled down with the cooling sheet or the like to prevent rise in temperature of the quartz substrate 20.

In FIG. 6 (c), the metal mask 30 is removed. The metal mask 30 is removed in a manner similar to the first embodiment. In FIG. 6 (d), the metal masks 30, which are the same as those used in S1 in the first embodiment, are formed on the other main surface 26 of the quartz substrate 21.

In FIG. 6 (e), the dry etching is performed. This etching is performed up to the vicinity of the main surface 27. At this time, the main surface 27 is brought in contact with the cooling sheet or the like to prevent rise in temperature of the quartz substrate 21. Furthermore, this etching is performed in a manner to leave one part of the etching-processed portion 25 unetched. The quartz substrate 22, which is etched from both the main surface 26 and the other main surface 27, can be obtained through the process of S5.

In FIG. 6 (f), the metal mask 30 is removed.

In FIG. 6 (g), the wet etching is performed to remove part of the etching-processed portion 25 of the quartz substrate 22. The embodiment as described above produces a following effect in addition to the affects of the first embodiment.

(3) Since the main surface 27 is provided with only the flutes 4, a sufficient contact area can be offered for the cooling sheet to be brought in contact therewith at the time when the dry etching is performed to the quartz substrate 21 from the main surface 26, so that the quartz substrate 21 can be prevented from becoming contorted due to rise in temperature.

This invention is not limited to the above-described embodiments but includes variations and modifications within the range of achieving the purpose of this invention. For example, this invention is applicable to an AT-cut resonator or a gyro element. In the tuning-fork quartz resonator element 10, each of exciting electrodes and sensing electrodes, which extend down to the base 2, is provided to the front and back surfaces (including side surfaces) of the resonating arm 3 and an interior of the flute 4. The tuning-fork quartz resonator element 10 is contained in a package to constitute the quartz resonator and is coupled to an external circuit for use.

What is claimed is:

1. A method for manufacturing a piezoelectric resonator element from a substrate made of a piezoelectric material, the method comprising:
    forming a first dry etching mask on a first masking region of a first surface of the substrate in a first mask forming process;
    forming a plurality of openings in the first dry etching mask;
    performing a first dry etching process;
    removing a portion of the substrate within each of the plurality of openings during the first dry etching process and after the first mask forming process to form a plurality of flutes;
    removing a portion of the substrate in areas between the first dry etching mask during the first dry etching process and after the first dry etching mask forming process to form etching-processed portions that extend into the substrate to a greater extent than each of the plurality of flutes after the first mask forming process;
    maintaining a first un-etched portion of the substrate remaining from each of the removed portions of the substrate in the areas between the first dry etching mask after the first dry etching process;
    forming an affected layer corresponding to the openings of the first dry etching mask and substrate during the first dry etching process;
    removing the first dry etching mask in a mask removing process and after the first dry etching process;
    performing a wet etching process;
    removing the affected layer during the wet etching process and following the removal of the first dry etching mask;
    etching a bottom surface of each flute during the wet etching process such that the bottom surface of each flute includes a sloped surface; and removing the first un-etched portion of the substrate during the wet etching process and after the mask removing process to form the piezoelectric resonator element.

2. The method for manufacturing a piezoelectric resonator element according to claim 1, further comprising forming a second dry etching mask on a second masking region of a second surface of the substrate in a second mask forming process, wherein the second surface of the substrate is on an opposite side from the first surface.

3. The method for manufacturing a piezoelectric resonator element according to claim 2, further comprising performing a second dry etching process to remove a portion of the substrate in areas between the second dry etching mask after the second mask forming process.

4. The method for manufacturing a piezoelectric resonator element according to claim 3, further comprising maintaining a second un-etched portion of the substrate remaining from each of the removed portions of the substrate in the areas of the second surface between the second dry etching mask after the second dry etching process.

5. The method for manufacturing a piezoelectric resonator element according to claim 4, further comprising removing the second dry etching mask in a mask removing process after the second dry etching process.

6. The method for manufacturing a piezoelectric resonator element according to claim 5, wherein performing the wet etching process removes the first un-etched portion of the substrate and the second un-etched portion of the substrate after the first mask removing process and the second mask removing process.

7. The method for manufacturing a piezoelectric resonator element according to claim 1, wherein the piezoelectric resonator element is a tuning-fork quartz resonator element.

* * * * *